US008802535B2

(12) United States Patent  
Bangsaruntip et al.

(10) Patent No.: US 8,802,535 B2
(45) Date of Patent: Aug. 12, 2014

(54) DOPED CORE TRIGATE FET STRUCTURE AND METHOD

(75) Inventors: Sarunya Bangsaruntip, Mount Kisco, NY (US); Siyuranga O. Koswatta, Bedford Hills, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 13/461,935

(22) Filed: May 2, 2012

(65) Prior Publication Data

US 2013/0292701 A1 Nov. 7, 2013

(51) Int. Cl.
*H01L 21/331* (2006.01)

(52) U.S. Cl.
USPC .................. 438/365; 257/365; 257/E21.14

(58) Field of Classification Search
CPC ................. H01L 29/7854; H01L 29/772
USPC ........... 438/4, 705; 216/62; 257/E21.14, 255, 257/611, 201, E29.297, E31.044, 365; 215/62
See application file for complete search history.

(56) References Cited

U.S. PATENT DOCUMENTS

| | | | |
|---|---|---|---|
| 5,920,095 A | 7/1999 | Davies et al. | |
| 6,884,688 B2 | 4/2005 | Esmark et al. | |
| 7,202,517 B2 | 4/2007 | Dixit et al. | |
| 7,235,468 B1 | 6/2007 | Mouli | |
| 7,646,046 B2 | 1/2010 | Russ et al. | |
| 7,884,004 B2 | 2/2011 | Bangsaruntip et al. | |
| 7,902,014 B2 | 3/2011 | Doyle et al. | |
| 8,110,467 B2 | 2/2012 | Chang et al. | |
| 2009/0242964 A1* | 10/2009 | Akil et al. | 257/324 |
| 2011/0101424 A1 | 5/2011 | Daly et al. | |
| 2011/0193141 A1* | 8/2011 | Lin et al. | 257/255 |
| 2012/0168913 A1* | 7/2012 | Toh et al. | 257/618 |
| 2012/0319211 A1* | 12/2012 | van Dal et al. | 257/401 |
| 2012/0319212 A1* | 12/2012 | Liaw | 257/401 |
| 2013/0001741 A1* | 1/2013 | Mann et al. | 257/529 |
| 2013/0045576 A1* | 2/2013 | Tsai et al. | 438/151 |
| 2013/0071980 A1* | 3/2013 | Lin et al. | 438/300 |
| 2013/0082304 A1* | 4/2013 | Liu et al. | 257/192 |
| 2013/0200483 A1* | 8/2013 | Tung, Yu-Cheng | 257/506 |

OTHER PUBLICATIONS

Fried et al., Comparison study of FinFETs: SOI vs. Bulk: Performance, Manufacturing Variability and Cost, SOI industry Consortium (2011).
Liu, "Multi-Gate MOSFETs Front-End Process and Materials Needs," Dep. of Electrical Engineering and Computer Sciences, University of California, Berkeley, CA 94720 (Aug. 20, 2008).

(Continued)

*Primary Examiner* — Caridad Everhart
(74) *Attorney, Agent, or Firm* — Louis J. Percello; Michael J. Chang, LLC (57) ABSTRACT

Techniques for fabricating a field effect transistor (FET) device having a doped core and an undoped or counter-doped epitaxial shell are provided. In one aspect, a method of fabricating a FET device is provided. The method includes the following steps. A wafer is provided having a semiconductor material selected from the group consisting of silicon, silicon germanium and silicon carbon. At least one fin core is formed in the wafer. Ion implantation is used to dope the fin core. Corners of the fin core are reshaped to make the corners rounded or faceted. An epitaxial shell is grown surrounding the fin core, wherein the epitaxial shell includes a semiconductor material selected from the group consisting of silicon, silicon germanium and silicon carbon.

28 Claims, 9 Drawing Sheets

(56) References Cited

OTHER PUBLICATIONS

Yong-Bin Kim, "Review paper: Challenges for Nanoscale MOSFETs and Emerging Nanoelectronics," Trans. Electr. Electron. Mater. 10(1) 21 (2009): G.-D. Hong et al.
Changhwan Shin, "Advanced MOSFET Designs and Implications for SRAM Scaling," Doctor of Philosophy Dissertation—University of California, Berkeley—Spring 2011.
Lecture 33-17-super-steep retrograde body doping, the "Short" Metal-Oxide-Semiconductor Field-Effect Transistor, Jesus del Alamo, course materials for 6.720J Integrated Microelectronic Devices, Spring 2007, Massachusetts Institute of Technology-Integrated Microelectronic Devices—Spring 2007.
Mittal et al., "Epitaxialy defined (ED) FinFET: to reduce Vt variability and enable multiple Vt," DRC2012.

* cited by examiner

DOPED CORE TRIGATE FET STRUCTURE AND METHOD

FIELD OF THE INVENTION

The present invention relates to field effect transistor (FET) devices and more particularly, to techniques for fabricating a FET device structure having a doped core and an undoped or counter-doped, defect-free epitaxial shell.

BACKGROUND OF THE INVENTION

As scaling conventional planar complementary metal-oxide semiconductor (CMOS) becomes increasingly challenging, several non-planar device structures have been considered. One such non-planar device structure is a tri-gate field effect transistor (FET). A tri-gate FET achieves superior short channel characteristics from the electrostatics that the geometry of the structure provides.

However, one issue with tri-gate FETs is that small width/height dimensions are required to obtain good short channel control. There are two issues here. First, variation due to process control and roughness, i.e., line edge roughness (LER). The second is effective total device width, which is lessened as the device width and height are reduced.

Therefore, improved FET fabrication techniques would be desirable.

SUMMARY OF THE INVENTION

The present invention provides techniques for fabricating a field effect transistor (FET) device having a doped core and an undoped or counter-doped epitaxial shell. In one aspect of the invention, a method of fabricating a FET device is provided. The method includes the following steps. A wafer is provided having a semiconductor material selected from the group consisting of silicon, silicon germanium and silicon carbon. At least one fin core is formed in the wafer. Ion implantation is used to dope the fin core. Corners of the fin core are reshaped to make the corners rounded or faceted. An epitaxial shell is grown surrounding the fin core, wherein the epitaxial shell comprises a semiconductor material selected from the group consisting of silicon, silicon germanium and silicon carbon.

In another aspect of the invention, another method of fabricating a FET device is provided. The method includes the following steps. A wafer is provided having a semiconductor material selected from the group consisting of silicon, silicon germanium and silicon carbon. At least one fin core is formed in the wafer. Ion implantation is used to dope the fin core. An epitaxial shell is grown surrounding the fin core, wherein the epitaxial shell includes a semiconductor material selected from the group consisting of silicon, silicon germanium and silicon carbon. A shallow trench isolation (STI) oxide is deposited onto the epitaxial shell. The STI oxide and the epitaxial shell are polished down to a top surface of the fin core and thereby exposing the fin core. The epitaxial shell and the fin core are recessed in the STI oxide forming a recessed region. An epitaxial layer is grown on the epitaxial shell and the fin core in the recessed region, wherein the epitaxial layer includes a semiconductor material selected from the group consisting of silicon, silicon germanium and silicon carbon.

In yet another aspect of the invention, yet another method of fabricating a FET device is provided. The method includes the following steps. A wafer is provided having a semiconductor material selected from the group consisting of silicon, silicon germanium and silicon carbon. At least one fin core is formed in the wafer. Ion implantation is used to dope the fin core. An epitaxial shell is grown surrounding the fin core, wherein the epitaxial shell includes a semiconductor material selected from the group consisting of silicon, silicon germanium and silicon carbon. A nitride material is deposited onto the epitaxial shell. The nitride material and the epitaxial shell are polished down to a top surface of the fin core and thereby exposing the fin core. A thermal oxide is formed on the epitaxial shell and the fin core that consumes a portion of the epitaxial shell and the fin core. The thermal oxide is removed to form a recessed region wherein the epitaxial shell and the fin core are recessed in the nitride material. An epitaxial layer is grown on the epitaxial shell and the fin core in the recessed region, wherein the epitaxial layer includes a semiconductor material selected from the group consisting of silicon, silicon germanium and silicon carbon.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for fabricating a tri-gate field effect transistor (FET) device that has a doped core and an undoped or counter-doped shell. As will be described in detail below, with this configuration good short channel effects can be maintained with relaxed geometry requirements as compared to conventional tri-gate devices. See above. This advantage is the result of the versatile doping options available with the present techniques.

Several exemplary tri-gate process flows are presented herein. The first involves forming a rounded/faceted tri-gate structure and is described by way of reference to FIGS. 1-5.

The starting structure is a semiconductor-on-insulator (SOI) or bulk semiconductor wafer. In general, a SOI wafer includes an SOI layer separated from a substrate by a buried oxide or BOX. According to an exemplary embodiment, when a SOI wafer is employed, the SOI layer is an undoped or predoped silicon (Si), silicon germanium (SiGe) or silicon carbon (SiC) layer. Si, SiGe and silicon carbon SOI wafers are commercially available. Suitable bulk wafers include, but are not limited to, bulk Si, SiGe and SiC wafers all of which are also commercially available.

Figure 1:
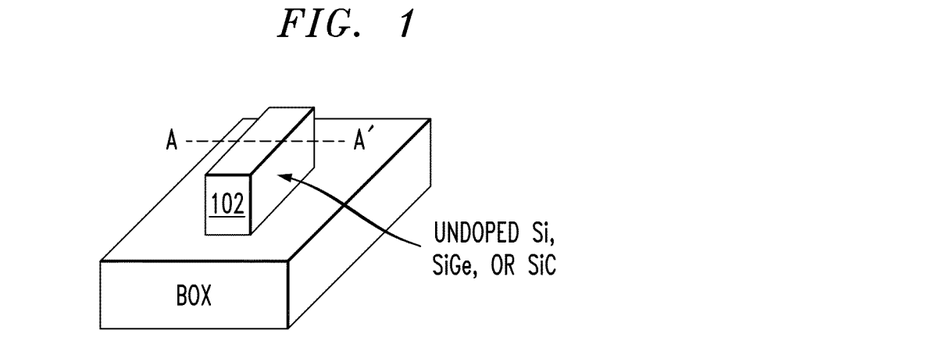
FIG. 1 is a three-dimensional diagram illustrating a fin having been patterned in a wafer according to an embodiment of the present invention.
Figure 2:
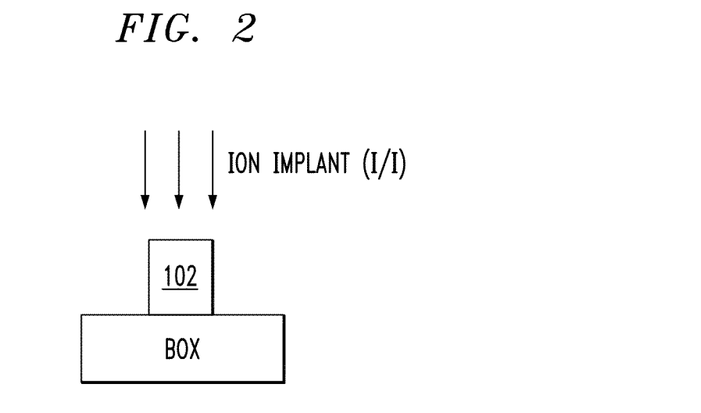
FIG. 2 is a cross-sectional diagram illustrating an ion implantation process being used to dope the fin according to an embodiment of the present invention.

Next, as shown in FIG. 1 a fin 102 is patterned in the wafer. It is notable that for ease and clarity of description, only a single fin is shown in the figures. However, the fabrication of multiple devices may be desirable which would involve patterning multiple fins 102. The steps for processing multiple fins would be the same as those described below for the single fin 102. Standard patterning techniques can be employed to pattern the fins in the wafer.

It is notable that the example of using an SOI wafer is what is shown illustrated in the figures, wherein the fin 102 is patterned in the SOI layer. The substrate, which as highlighted above is typically present below the BOX, is not shown. If a bulk semiconductor wafer is instead used, then an additional junction isolation step after the fins are patterned would be employed to isolate the fins. Junction isolation techniques are described, for example, in Fried et al., "Comparison study of FinFETs: SOI vs. Bulk: Performance, Manufacturing Variability and Cost, SOI industry Consortium (2011), the contents of which are incorporated by reference herein. The following steps of the process are described by way of reference to cross-sectional cuts through the structure of FIG. 1 (along line A-A').

Next, the fin 102 is doped. See FIG. 2 which shows ion implantation (I/I) into the fin 102. The dopant(s) employed depend on the particular device being formed. By way of example only, if the device being produced is an n-channel FET (NFET), then according to an exemplary embodiment, a p-type dopant is implanted into the fin 102 (resulting in a p-doped core, see below). Suitable p-type dopants include, but are not limited to, boron. Alternatively, when the device being produced is a p-channel FET (PFET), then according to an exemplary embodiment, an n-type dopant is implanted into the fin 102 (resulting in an n-doped core, see below). Suitable n-type dopants include, but are not limited to, phosphorus and arsenic.

According to an exemplary embodiment, the doping of the core is performed by ion implantation, and annealing the structure at a temperature of from about 600 degrees Celsius (° C.) to about 1,000° C. The result is a doped core 302. See FIG. 3. Other methods to dope the core, including (but not limited to) plasma doping or solid source diffusion, followed with a subsequent anneal could also be used.

Figure 3:
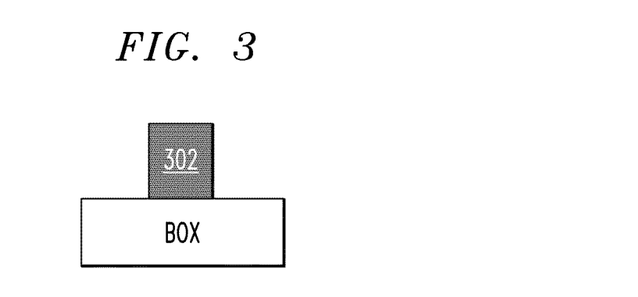
FIG. 3 is a cross-sectional diagram illustrating the doped fin which will form a doped core of the tri-gate FET device according to an embodiment of the present invention.

As will be described below, an epitaxial shell will be formed over the doped core 302. If this epitaxial shell is formed over the doped core 302 as it is currently configured, the presence of sharp corners at the top of the core can result in epi defects in the shell at the corners. To prevent these defects from occurring, it is desirable to first round-off or facet (i.e., reshape) the corners of the doped core.

According to an exemplary embodiment, this reshaping of the doped core is accomplished by annealing the core in a non-reactive gas (i.e., a gas that does not react with the fin material) such as hydrogen ($H_2$), helium (He) and potentially others. This step causes the fin material to reflow, resulting in the fin taking on a more rounded/faceted shape. This reshaping process is described, for example, in U.S. Pat. No. 7,884,004 issued to Bangsaruntip et al., entitled "Maskless Process for Suspending and Thinning Nanowires" (hereinafter "U.S. Pat. No. 7,884,004"), the entire contents of which are incorporated by reference herein. According to an exemplary embodiment, the structure is contacted with the non-reactive gas at a temperature, pressure and for a duration sufficient to cause redistribution of the fin material. According to an exemplary embodiment, the non-reactive gas anneal is performed with a gas pressure of from about 30 torr to about 1,000 torr, at a temperature of from about 600° C. to about 1,100° C. and for a duration of from about one minute to about 120 minutes.

Figure 4:
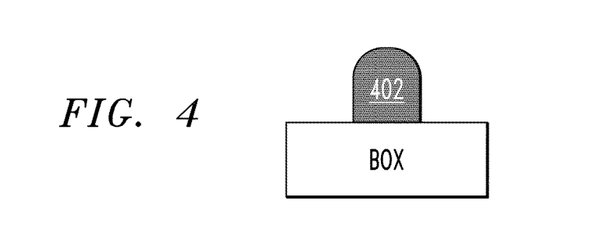
FIG. 4 is a cross-sectional diagram illustrating a reshaping process having been performed to round-off the corners of the doped core according to an embodiment of the present invention.
Figure 26:
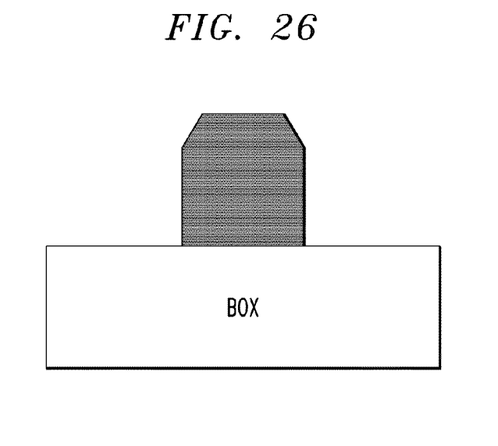
FIG. 26 is a cross-sectional diagram illustrating the doped core having faceted corners (as compared to rounded corners) after a reshaping process has been performed according to an embodiment of the present invention.

It is notable that whether the corners of the doped core by way of the reshaping process end up rounded or faceted depends on the specific parameters of the reshaping. However, both rounded or faceted corners are suitable according to the present teachings. A core with rounded corners is shown in FIG. 4 wherein the re-shaped core is now given the reference numeral 402, whereas a core with faceted corners is shown in FIG. 26 (described below). Rounding involves a curve with some radius. Faceting would be more like three lines (one horizontal, one at 45 degrees, and one vertical, i.e., all straight edges).

When one looks at silicon that has been reshaped with a hydrogen anneal, if the features are big, faceting is generally observed. On an atomic scale (i.e., 10 nm and less), the faceting is not as observable and features look more round. Since the hydrogen anneal essentially re-configures the silicon to a shape with the lowest free energy, it will tend to result in a facet, but if the anneal is not long enough, it may not get there and thus may appear more rounded.

Next, an epitaxial Si, SiGe or SiC shell 502 is formed over the doped core. See FIG. 5. Shell 502 can be formed using standard epitaxial growth processes. Advantageously, since the shell 502 is being epitaxially grown over a rounded/faceted core structure, the presence of defects in the epitaxial layer could be prevented. With this core/shell process and structure, the configuration of the device can beneficially be tailored to the particular application at hand. For instance, it may be desirable to employ a different material for the shell than that used in the core. By way of example only, growing an epitaxial Si shell on a SiGe core will impart tensile strain in the structure. Tensile strain in the channel region of the device is favorable when an NFET is being formed. Alternatively, growing an epitaxial SiGe shell on a Si core will impart compressive strain in the structure. Compressive strain in the channel region of the device is favorable when a PFET is being formed. Alternatively, the same material can be used for both the core and for the shell (since the core is doped while the shell might be undoped or counter-doped, see below).

Figure 5:
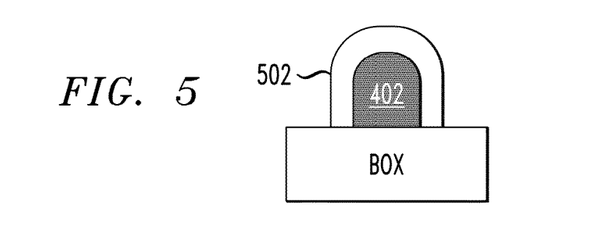
FIG. 5 is a cross-sectional diagram illustrating an epitaxial shell having been formed over the doped core according to an embodiment of the present invention.

As described above, the shell can be undoped (i.e., intrinsic Si, SiGe or SiC), or alternatively, the shell can be counter-doped. Namely, a dopant may be introduced during the formation of the epitaxial shell 502. The techniques for use of a dopant during epitaxy are generally known to those of skill in the art and thus are not described further herein.

The term "counter-doping" signifies that a dopant of an opposite polarity from that of the core is used in the shell. Thus, when the core is p-doped, the shell in n-doped, and vice-a-versa. Suitable n-type and p-type dopants were provided above. Counter-doping serves to reduce the impact of the dopants (if any) that can migrate from the core into the shell. According to an exemplary embodiment, the dopant concentration in the shell is less than the dopant concentration in the core (i.e., the shell is lightly doped). By way of example only, the core may be doped at a concentration of from about $1 \times 10^{18}$ cm$^{-3}$ to about $1 \times 10^{19}$ cm$^{-3}$ while the shell is doped at a concentration of from about $1 \times 10^{17}$ cm$^{-3}$ to about $5 \times 10^{17}$ cm$^{-3}$. By more heavily doping the core (as compared to the shell), the beneficial electrostatic short-channel effects are achieved (i.e., if the core was only lightly doped (e.g., at a concentration of less than $1 \times 10^{18}$ cm$^{-3}$, then these beneficial electrostatic short-channel effects would be lost). The steps needed to achieve a desired dopant concentration in the core and shell, given the teachings presented herein, would be apparent to one of skill in the art. Counter-doping may be used both in the case where the same material is used in the core and the shell and where different core and shell materials are used (for example to impart strain in the channel as provided above). Standard metal-oxide semiconductor FET (MOSFET) processing steps may then be performed to form gate/source/drain regions of the device and complete the fabrication process.

Another exemplary tri-gate process flow is now described by way of reference to FIGS. 6-13. This process also involves two epitaxial steps. The starting steps for this second method are the same as those described in conjunction with the description of FIGS. 1-3, above (and that description is incorporated by reference herein). Thus, the description here begins with the same structure as shown in FIG. 3.

Figure 6:
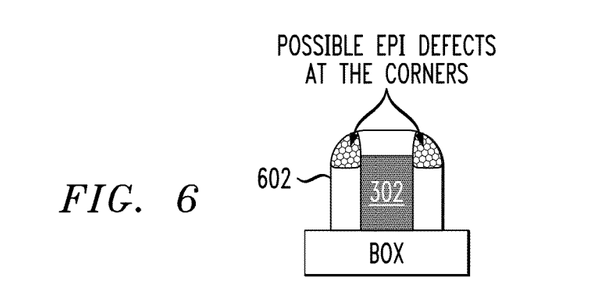
FIG. 6 is a cross-sectional diagram illustrating an epitaxial shell having been formed over the doped core of FIG. 3, the shell showing defects at the corners of the core according to an embodiment of the present invention.

By comparison with the first process described above, here a reshaping process is not used to round-off or facet the corners of the doped core 302. Thus, as shown in FIG. 6, when the undoped or counter-doped epitaxial Si, SiGe, or SiC shell 602 is grown on the core 302 (see description of the process used to form the epitaxial shell), defects in the shell are possible. This is the first epitaxy step in this exemplary process. As noted above, the figures depict cross-sectional cuts through the structure of FIG. 1 (along line A-A').

Figure 7:
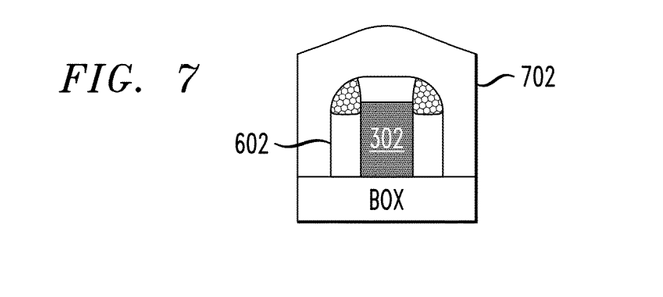
FIG. 7 is a cross-sectional diagram illustrating a shallow trench isolation (STI) oxide having been blanket deposited onto the structure covering the shell according to an embodiment of the present invention.
Figure 8:
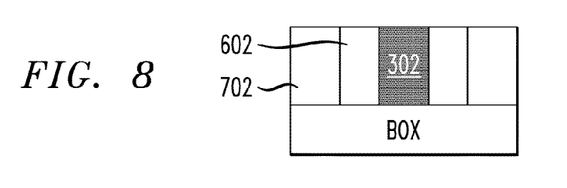
FIG. 8 is a cross-sectional diagram illustrating the STI oxide having been polished down to the top surface of the core according to an embodiment of the present invention.

As shown in FIG. 7, a shallow trench isolation (STI) oxide 702 is then blanket deposited onto the structure covering the shell 602. According to an exemplary embodiment, the STI oxide is deposited using a spin on process or chemical vapor deposition (CVD). The STI oxide 702 is then polished down to the top surface of the core 302 using, e.g., chemical mechanical polishing (CMP), thus effectively removing the defect portion of the shell 602 (compare FIG. 7 and FIG. 8) and exposing the core 302.

The shell 602 and core 302 are then recessed selective to the STI oxide 702. See FIG. 9. By way of example only, a selective reactive ion etching (RIE) or selective wet chemical etching can be performed to etch the shell 602 and the core 302 selective to the STI oxide 702. The etch can be end-pointed so as to leave a desired amount of the shell 602 and core 302 remaining. By way of example only, the vertical recess depth should be about equivalent to the thickness of the shell.

Figure 9:
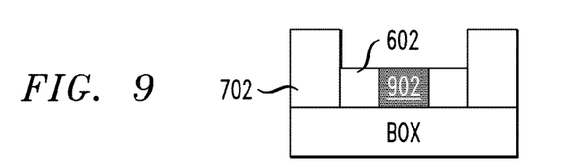
FIG. 9 is a cross-sectional diagram illustrating the shell and the core having been recessed selective to the STI oxide according to an embodiment of the present invention.

Following the recess etch, an anneal is performed in the presence of a non-reactive gas (see description above regarding exemplary non-reactive gasses and processing conditions) to recover the surface (i.e., to remove any surface defects caused by the recess etch, and to recover a smooth surface for subsequent epi-growth, see below) so as to prevent defects during the second epitaxy step to be performed next. The doped core following this annealing process is now given the reference numeral 902.

Figure 10:
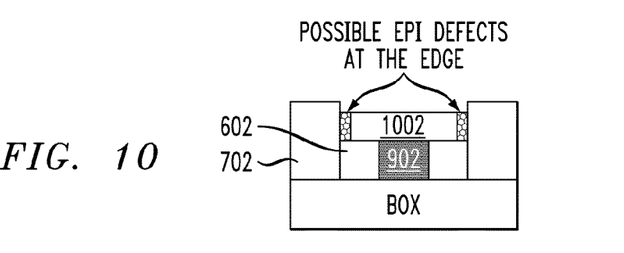
FIG. 10 is a cross-sectional diagram illustrating an epitaxial layer having been grown on the core and shell in the recessed area, the epitaxial layer may have defects on edges thereof according to an embodiment of the present invention.

Epitaxial Si, SiGe or SiC layer 1002 is then grown on the core 902/shell 602 in the recessed area with a thickness and composition similar to that of the original shell region 602 (i.e., by example only, within 5% of the thickness and composition of the original shell region—staying within 5% of concentration values—for instance if the original shell region is SiGe (30%) with $1 \times 10^{17}$ cm$^{-3}$ boron doping, then the epitaxial layer should have both Ge % and boron concentration within 5% of the original shell region). See FIG. 10. This is the second epitaxy in this exemplary two-step epitaxy process. As shown in FIG. 10, defects may be present in this epitaxial layer 1002. However, due to the presence of the STI oxide 702, the defects in the epitaxial layer 1002 would likely occur at the edges proximate to the STI oxide. The reason that defects appear on this edge is due to the constrained growth (i.e., the growth would like to keep going on the sides but is physically prevented by the presence of the STI oxide layer). Wherever constrained growth occurs, defects result. These defects, if present, will be removed later in the process.

Figure 11:
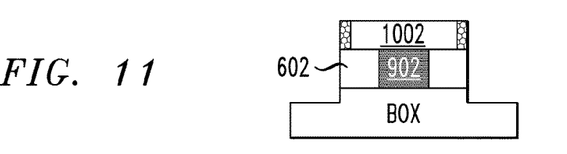
FIG. 11 is a cross-sectional diagram illustrating the STI oxide having been selectively removed according to an embodiment of the present invention.
Figure 12:
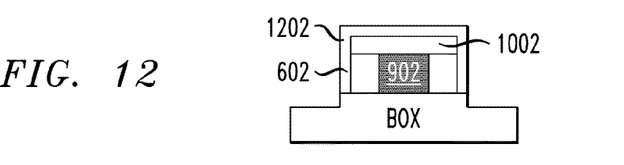
FIG. 12 is a cross-sectional diagram illustrating a layer of thermal oxide having been grown on the epitaxial shell according to an embodiment of the present invention.
Figure 13:
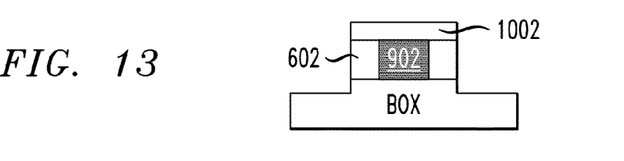
FIG. 13 is a cross-sectional diagram illustrating the thermal oxide having been removed leaving behind a defect-free epitaxial shell surrounding the core according to an embodiment of the present invention.

As shown in FIG. 11, the STI oxide 702 is removed selective to the shell 602/epitaxial layer 1002. According to an exemplary embodiment, the STI oxide 702 is removed using an oxide-selective RIE or a wet chemical etch. The epitaxial layer 1002 along with shell 602 will form the shell of the device. Thus these layers may also be referred to herein collectively as the shell. It is also notable that as provided above, the epitaxial "shell" material can be undoped or lightly counter-doped and/or can contain the same or different materials from the core (e.g., so as to favorably impart strain in the channel, see above).

Next, in order to remove the defects (if any) present in the epitaxial layer 1002, a layer of thermal oxide 1202 is grown on the epitaxial shell (i.e., on shell 602/epitaxial layer 1002). See FIG. 12. In general, thermal oxidation is typically carried out at a temperature of from about 800° C. to about 1,200° C. in the presence of an oxidant, with the range of from about 800° C. to about 900° C. being preferred to reduce excessive dopant diffusion. The thermal oxide 1202 will incorporate Si, SiGe or SiC consumed from the epitaxial shell and oxygen from the ambient. Thus, the oxidation process should be tailored such that the thermal oxide 1202 consumes enough of the epitaxial shell that the defects are no longer present. See FIG. 12. The thermal oxide can then be removed (using, e.g., a selective RIE or a wet chemical etch) leaving behind a defect-free epitaxial shell surrounding the core 902. See FIG. 13.

Standard MOSFET processing steps may then be performed to form gate/source/drain regions of the device and complete the fabrication process. Techniques for forming source/drain regions in a FET device are described, for example, in U.S. Pat. No. 8,110,467 issued to Chang et al., entitled "Multiple Vt Field-Effect Transistor Devices," the contents of which are incorporated by reference herein.

Another exemplary tri-gate process flow is now described by way of reference to FIGS. 14-22 and involves a two-step epitaxial process. The starting steps for this second method are the same as those described in conjunction with the description of FIGS. 1-3, above (and that description is incorporated by reference herein). Thus, the description here begins with the same structure as shown in FIG. 3.

Figure 14:
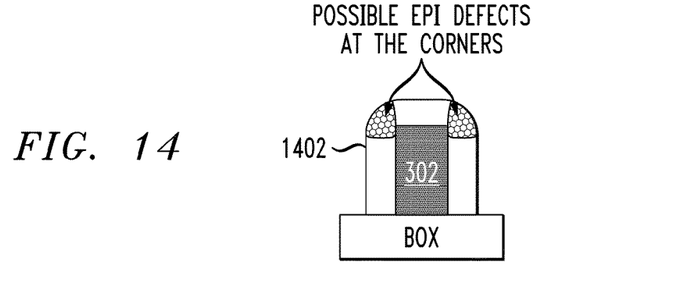
FIG. 14 is a cross-sectional diagram illustrating an epitaxial shell having been formed over the doped core of FIG. 3, the shell showing defects at the corners of the core according to an embodiment of the present invention.

By comparison with the first process described above, here a reshaping process is not used to round-off or facet the corners of the doped core 302. Thus, as shown in FIG. 14, when the undoped or counter-doped epitaxial Si, SiGe, or SiC shell 1402 is grown on the core 302 (see description of the process used to form the epitaxial shell), defects in the shell are possible. This is the first epitaxy step in this exemplary process. As noted above, the figures depict cross-sectional cuts through the structure of FIG. 1 (along line A-A').

Figure 15:
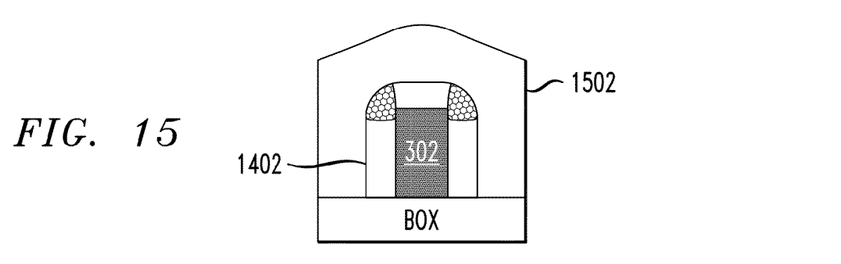
FIG. 15 is a cross-sectional diagram illustrating a nitride material having been blanket deposited onto the structure covering the shell according to an embodiment of the present invention.
Figure 16:
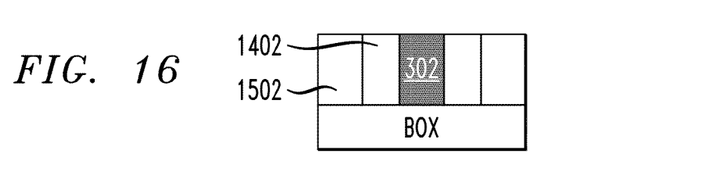
FIG. 16 is a cross-sectional diagram illustrating the nitride material having been polished down to the top surface of the core according to an embodiment of the present invention.

As shown in FIG. 15, a nitride material 1502 (e.g., silicon nitride) is then blanket deposited onto the structure covering the shell 1402. According to an exemplary embodiment, the nitride material is deposited using a CVD process such as plasma enhanced CVD (PECVD). As shown in FIG. 16, the nitride material 1502 is then polished down to the top surface of the core 302 using, e.g., CMP, thus effectively removing the defect portion of the shell 1402 (compare FIG. 15 and FIG. 16) and exposing the core 302.

Figure 17:
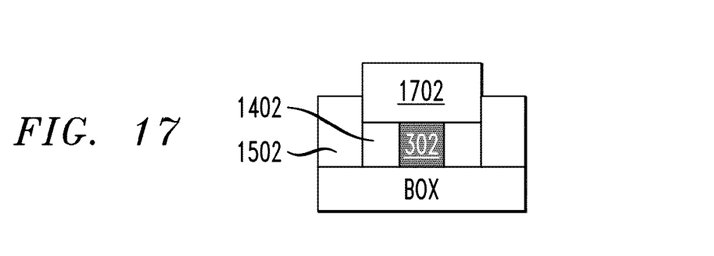
FIG. 17 is a cross-sectional diagram illustrating a thermal oxide having been grown on the core and shell according to an embodiment of the present invention.

A thermal oxide 1702 is then grown on the core 302/shell 1402. See FIG. 17. The parameters for thermal oxidation were discussed above. The thermal oxide will grow only on the core 302/shell 1402 and as shown in FIG. 17 will consume a portion of the core 302/shell 1402. The thermal oxide 1702 is then removed selective to the nitride material 1502 using, e.g., an oxide selective RIE or a wet chemical etch. The result is the shell and core being recessed in the thermal oxide material 1702. See FIG. 18.

Figure 18:
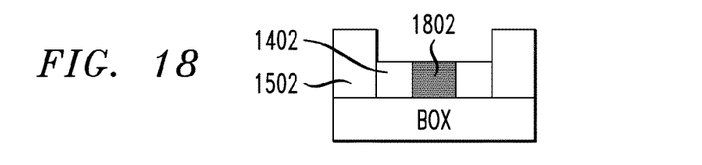
FIG. 18 is a cross-sectional diagram illustrating the thermal oxide having been removed resulting in the shell and core being recessed in the nitride material according to an embodiment of the present invention.

Following the removal of the thermal oxide, an anneal is performed in the presence of a non-reactive gas (see description above regarding exemplary non-reactive gasses and processing conditions) to recover the surface (i.e., to remove any surface defects caused by the recess etch, and to recover a smooth surface for subsequent epi-growth, see below) so as to prevent defects during the second epitaxy step to be performed next. The doped core following this annealing process is now given the reference numeral 1802.

Figure 19:
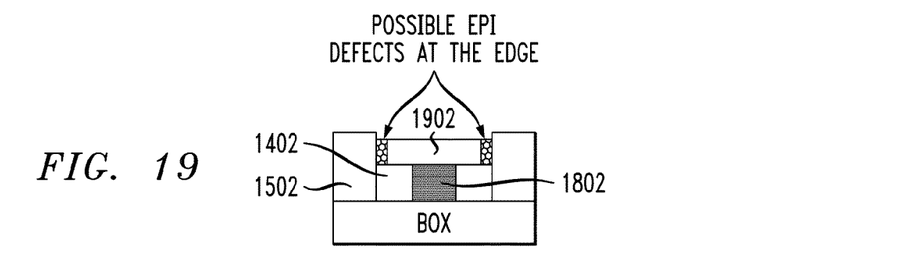
FIG. 19 is a cross-sectional diagram illustrating an epitaxial layer having been grown on the core and shell in the recessed area, the epitaxial layer may have defects on edges thereof according to an embodiment of the present invention.

Epitaxial Si, SiGe or SiC layer 1902 is then grown on the core 1802 and shell 1402 in the recessed area with a thickness and composition similar to that of the original shell region 1402 (i.e., by example only, within 5% of the thickness and composition of the original shell region—staying within 5% of concentration values—for instance if the original shell region is SiGe (30%) with $1\times10^{17}$ cm$^{-3}$ boron doping, then the epitaxial layer should have both Ge % and boron concentration within 5% of the original shell region). See FIG. 19. This is the second epitaxy in this exemplary two-step epitaxy process. As shown in FIG. 19, defects may be present in this epitaxial layer 1902. However, due to the presence of the nitride material 1502, the defects in the epitaxial layer 1902 would likely occur at the edges proximate to the nitride material 1502. The reason that defects appear on this edge is due to the constrained growth (i.e., the growth would like to keep going on the sides but is physically prevented by the presence of the nitride material layer). Wherever constrained growth occurs, defects result. These defects, if present, will be removed later in the process.

Figure 20:
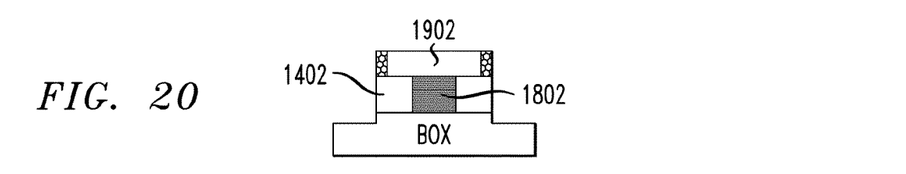
FIG. 20 is a cross-sectional diagram illustrating the nitride material having been selectively removed according to an embodiment of the present invention.
Figure 21:
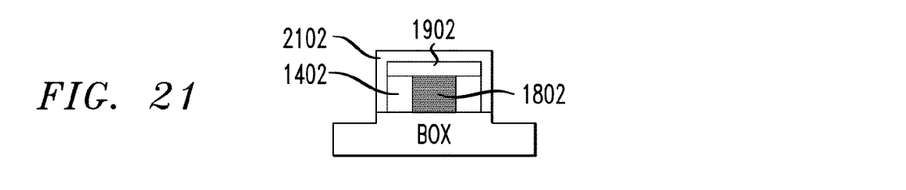
FIG. 21 is a cross-sectional diagram illustrating a layer of thermal oxide having been grown on the epitaxial shell according to an embodiment of the present invention.
Figure 22:
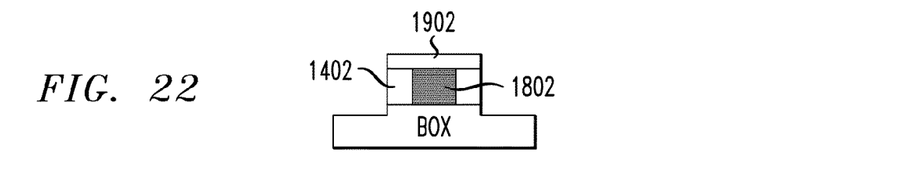
FIG. 22 is a cross-sectional diagram illustrating the thermal oxide having been removed leaving behind a defect-free epitaxial shell surrounding the core according to an embodiment of the present invention.

As shown in FIG. 20, the nitride material 1502 is removed selective to the shell 1402/epitaxial layer 1902. According to an exemplary embodiment, the nitride material 1502 is removed using an oxide-selective RIE or a wet chemical etch. The epitaxial layer 1902 along with shell 1402 will form the shell of the device. Thus these layers may also be referred to herein collectively as the shell. It is also notable that as provided above, the epitaxial "shell" material can be undoped or lightly counter-doped and/or can contain the same or different materials from the core (e.g., so as to favorably impart strain in the channel, see above).

Next, in order to remove the defects (if any) present in the epitaxial layer 1902, a layer of thermal oxide 2102 is grown on the epitaxial shell (i.e., on shell 1402/epitaxial layer 1902). See FIG. 21. The thermal oxide 2102 will incorporate Si, SiGe or SiC consumed from the epitaxial shell and oxygen from the ambient. Thus, the oxidation process should be tailored such that the thermal oxide 2102 consumes enough of the epitaxial shell that the defects are no longer present. See FIG. 21. The thermal oxide can then be removed (using, e.g., a selective RIE or a wet chemical etch) leaving behind a defect-free epitaxial shell surrounding the core 1802. See FIG. 22.

Figure 23:
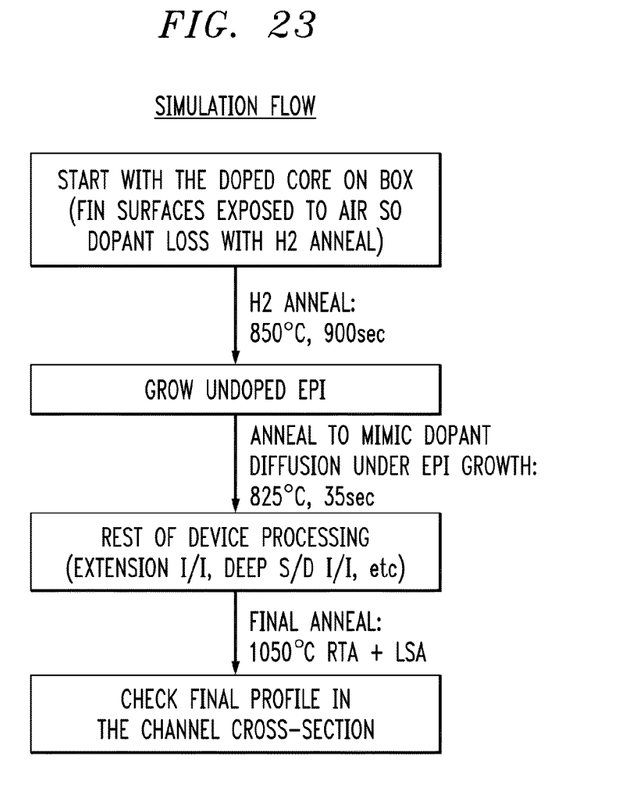
FIG. 23 is a diagram illustrating exemplary process flow steps for a simulation involving a rounded tri-gate structure according to an embodiment of the present invention.
Figure 24A:
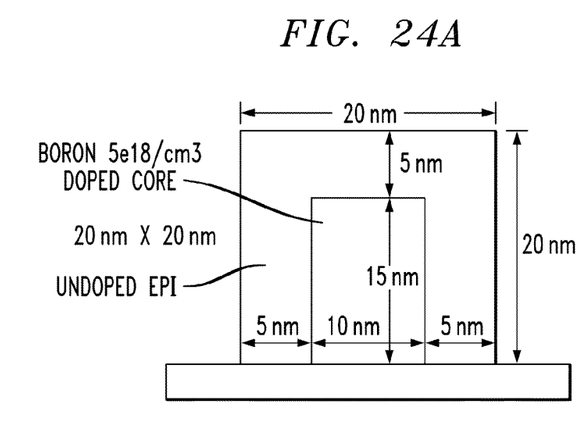
FIG. 24A-B are diagrams illustrating the results of the simulated process shown in FIG. 23 according to an embodiment of the present invention.
Figure 24B:
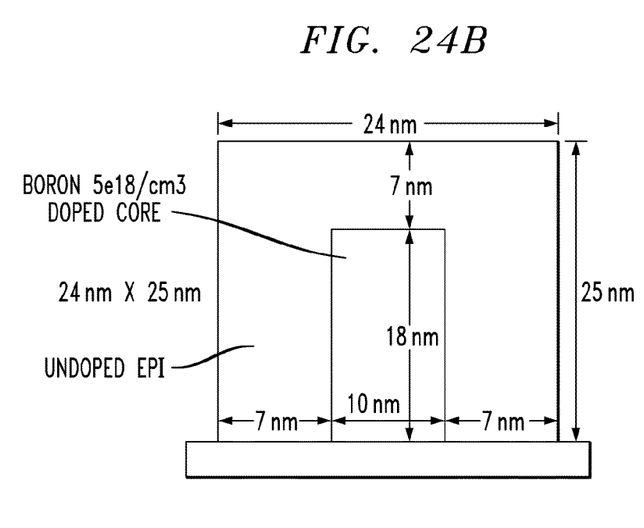

The present techniques are further illustrated by way of reference to the following non-limiting examples. An exemplary process flow employing the above-described rounded tri-gate structure (see FIGS. 1-5) was simulated wherein the starting structure was a doped core on a BOX (wherein the fin surfaces were exposed to air so dopant loss occurred during the hydrogen annealing (see above)). The steps of this simulated process flow are shown in FIG. 23. The structures employed for the simulated process are shown in FIGS. 24A and B. The dimensions shown are in nanometers (nm). The structures shown in FIGS. 24A and B are two different geometries. Specifically, the structure of FIG. 24B with relatively larger dimensions would be used in larger gate-length device node. The structure of FIG. 24A can be used in a later node where gate-length needs to be scaled down further.

Figure 25A:
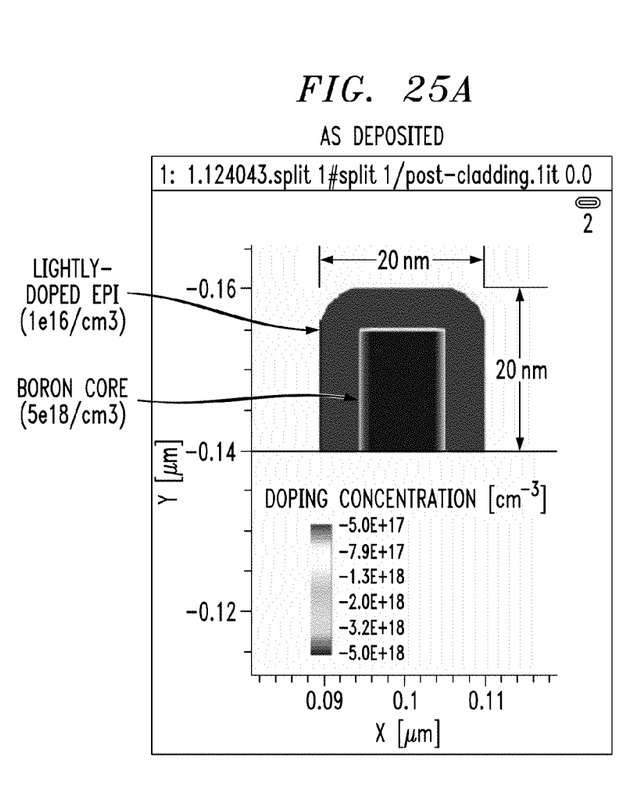
FIGS. 25A-B are diagrams illustrating simulation results of the present fabrication process both before and after a high temperature annealing according to an embodiment of the present invention.
Figure 25B:
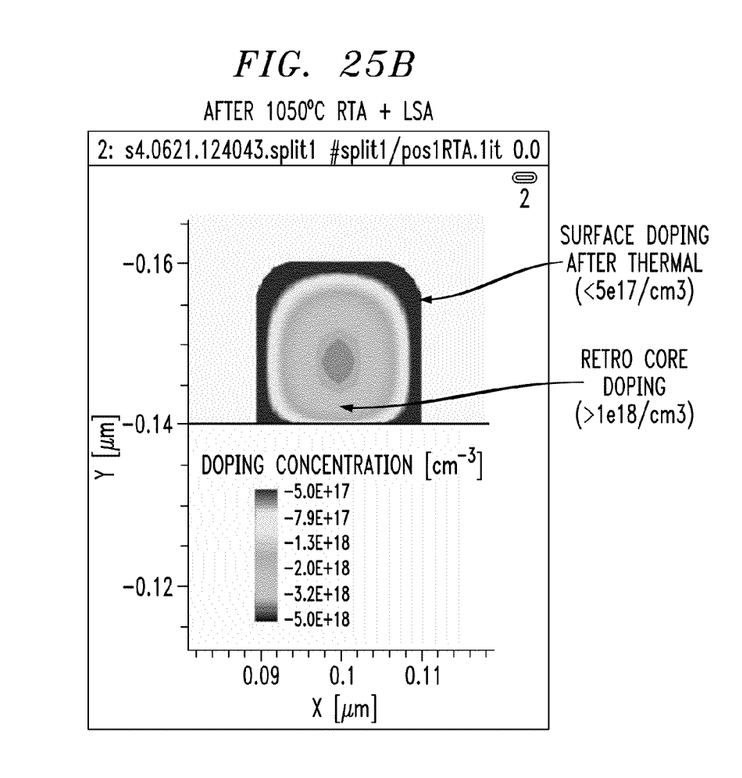

FIGS. 25A and B are diagrams illustrating simulation results of the present fabrication process of the exemplary structure of FIG. 24A (with a doped core and lightly doped shell), both before (FIG. 25A) and after (FIG. 25B) a high temperature annealing. As can be seen, the surface doping remains less than $5\times10^{17}$ cm$^{-3}$ after the worst thermal step in the process (1,050° C. rapid thermal anneal (RTA) and laser spike annealing (LSA)). The doping in the core area and near the bottom of the fin is greater than $1\times10^{18}$ cm$^{-3}$ which is beneficial in reducing short-channel effects.

FIG. 26 is a cross-sectional diagram illustrating a faceted core resulting from the above-described reshaping process. By comparison with the round-cornered core shown in FIG. 4 and described above, this faceted core has corners that are straight lines, but at horizontal, vertical and approximately 45 degrees angles (i.e., faceted). The details regarding the outcome of the reshaping process being rounded or faceted corners were provided above. A core with either rounded or faceted corners is suitable in accordance with the present techniques. Thus, the (faceted) core shown in FIG. 26 could be substituted for the rounded core shown in FIG. 4 and vice-a-versa.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a field effect transistor (FET) device, the method comprising the steps of:
   providing a wafer comprising a semiconductor material selected from the group consisting of silicon, silicon germanium and silicon carbon;
   forming at least one fin core in the wafer;
   using ion implantation to dope the fin core;
   reshaping corners of the fin core to make the corners rounded or faceted; and
   growing an epitaxial shell surrounding the fin core, wherein the epitaxial shell comprises a semiconductor material selected from the group consisting of silicon, silicon germanium and silicon carbon, and wherein the epitaxial shell is grown as a conformal layer completely covering an outer surface of the fin core such that the epitaxial shell when formed takes on a same shape as the outer surface of the fin core.

2. The method of claim 1, wherein the wafer comprises a semiconductor-on-insulator (SOI) wafer having an SOI layer over a buried oxide (BOX), wherein the SOI layer comprises a semiconductor material selected from the group consisting of silicon, silicon germanium and silicon carbon, and wherein the fin is formed in the SOI layer.

3. The method of claim 1, wherein the ion implantation is used to dope the fin core with an n-type dopant or a p-type dopant.

4. The method of claim 1, wherein the step of reshaping the corners of the fin core comprises the step of:
   annealing the fin core in the presence of a non-reactive gas to make the corners of the fin core rounded or faceted, and wherein by way of the annealing only the corners of the fin core are made rounded or faceted.

5. The method of claim 1, wherein the epitaxial shell is undoped.

6. The method of claim 1, wherein the epitaxial shell comprises a different semiconductor material from the fin core.

7. The method of claim 1, wherein the epitaxial shell is doped with an n-type dopant or a p-type dopant.

8. The method of claim 7, wherein the fin core is doped at a concentration of from about $1\times10^{18}$ cm$^{-3}$ to about $1\times10^{19}$ cm$^{-3}$ and the epitaxial shell is doped at a concentration of from about $1\times10^{17}$ cm$^{-3}$ to about $5\times10^{17}$ cm$^{-3}$.

9. The method of claim 7, wherein the epitaxial shell is counter-doped so as to have an opposite doping polarity from the fin core.

10. A method of fabricating a FET device, the method comprising the steps of:
    providing a wafer comprising a semiconductor material selected from the group consisting of silicon, silicon germanium and silicon carbon;
    forming at least one fin core in the wafer;
    using ion implantation to dope the fin core;
    growing an epitaxial shell surrounding the fin core, wherein the epitaxial shell comprises a semiconductor material selected from the group consisting of silicon, silicon germanium and silicon carbon;
    depositing a shallow trench isolation (STI) oxide onto the epitaxial shell;
    polishing the STI oxide and the epitaxial shell down to a top surface of the fin core and thereby exposing the fin core;
    recessing the epitaxial shell and the fin core in the STI oxide forming a recessed region; and
    growing an epitaxial layer on the epitaxial shell and the fin core in the recessed region, wherein the epitaxial layer comprises a semiconductor material selected from the group consisting of silicon, silicon germanium and silicon carbon.

11. The method of claim 10, wherein the epitaxial shell grown surrounding the fin core contains defects, and wherein the step of polishing the STI oxide and the epitaxial shell removes a portion of the epitaxial shell containing the defects.

12. The method of claim 10, wherein the step of polishing the STI oxide and the epitaxial shell is performed using chemical mechanical polishing (CMP).

13. The method of claim 10, wherein the epitaxial layer grown on the epitaxial shell and the fin core in the recessed region contains defects on one or more surfaces thereof, the method further comprising the steps of:
    forming a thermal oxide layer on the epitaxial layer and on the epitaxial shell that consumes a portion of the epitaxial layer containing the defects; and
    removing the thermal oxide layer.

14. The method of claim 10, further comprising the step of:
    annealing the fin core in the presence of a non-reactive gas before performing the step of growing the epitaxial layer on the epitaxial shell and the fin core in the recessed region.

15. A method of fabricating a FET device, the method comprising the steps of:
    providing a wafer comprising a semiconductor material selected from the group consisting of silicon, silicon germanium and silicon carbon;
    forming at least one fin core in the wafer;
    using ion implantation to dope the fin core;
    growing an epitaxial shell surrounding the fin core, wherein the epitaxial shell comprises a semiconductor material selected from the group consisting of silicon, silicon germanium and silicon carbon;

depositing a nitride material onto the epitaxial shell;

polishing the nitride material and the epitaxial shell down to a top surface of the fin core and thereby exposing the fin core;

forming a thermal oxide on the epitaxial shell and the fin core that consumes a portion of the epitaxial shell and the fin core;

removing the thermal oxide to form a recessed region wherein the epitaxial shell and the fin core are recessed in the nitride material;

growing an epitaxial layer on the epitaxial shell and the fin core in the recessed region, wherein the epitaxial layer comprises a semiconductor material selected from the group consisting of silicon, silicon germanium and silicon carbon.

16. The method of claim 15, wherein the epitaxial shell grown surrounding the fin core contains defects, and wherein the step of polishing the nitride material and the epitaxial shell removes a portion of the epitaxial shell containing the defects.

17. The method of claim 15, wherein the step of polishing the nitride material and the epitaxial shell is performed using CMP.

18. The method of claim 15, wherein the epitaxial layer grown on the epitaxial shell and the fin core in the recessed region contains defects on one or more surfaces thereof, the method further comprising the steps of:

forming a second thermal oxide layer on the epitaxial layer and on the epitaxial shell that consumes a portion of the epitaxial layer containing the defects; and removing the second thermal oxide layer.

19. The method of claim 15, further comprising the step of:

annealing the fin core in the presence of a non-reactive gas before performing the step of growing the epitaxial layer on the epitaxial shell and the fin core in the recessed region.

20. A FET device comprising:

a doped fin core formed on a wafer, wherein the doped fin core comprises a semiconductor material selected from the group consisting of silicon, silicon germanium and silicon carbon; and an epitaxial shell surrounding the doped fin core, wherein the epitaxial shell comprises a semiconductor material selected from the group consisting of silicon, silicon germanium and silicon carbon, and wherein the epitaxial shell is a conformal layer completely covering an outer surface of the doped fin core such that the epitaxial shell takes on a same shape as the outer surface of the fin core.

21. The FET device of claim 20, wherein the doped fin core is doped with an n-type dopant or a p-type dopant.

22. The FET device of claim 20, wherein the epitaxial shell is undoped.

23. The FET device of claim 20, wherein the epitaxial shell comprises a different semiconductor material from the doped fin core.

24. The FET device of claim 20, wherein the doped fin core has rounded or faceted corners.

25. The FET device of claim 20, wherein the epitaxial shell is doped with either an n-type dopant or a p-type dopant.

26. The FET device of claim 25, wherein the epitaxial shell is counter-doped so as to have an opposite doping polarity from the doped fin core.

27. The FET device of claim 25, wherein the epitaxial shell is doped at a first concentration and the doped fin core is doped at a second concentration, and wherein the first concentration is less than the second concentration.

28. The FET device of claim 27, wherein the doped fin core is doped at a concentration of from about $1\times10^{18}$ cm$^{-3}$ to about $1\times10^{19}$ cm$^{-3}$ and the epitaxial shell is doped at a concentration of from about $1\times10^{17}$ cm$^{-3}$ to about $5\times10^{17}$ cm$^{-3}$.

* * * * *